United States Patent
Barker et al.

(10) Patent No.: US 7,825,366 B2
(45) Date of Patent: Nov. 2, 2010

(54) METHODS AND SYSTEMS FOR EXTRACTING ENERGY FROM A HEAT SOURCE USING PHOTONIC CRYSTALS WITH DEFECT CAVITIES

(75) Inventors: Delmar L. Barker, Tucson, AZ (US); William R. Owens, Tucson, AZ (US); Abram G. Young, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 226 days.

(21) Appl. No.: 12/208,957

(22) Filed: Sep. 11, 2008

(65) Prior Publication Data
US 2009/0071529 A1 Mar. 19, 2009

Related U.S. Application Data

(60) Provisional application No. 60/972,070, filed on Sep. 13, 2007.

(51) Int. Cl.
*H01L 31/058* (2006.01)
*H02N 6/00* (2006.01)
*H04B 10/00* (2006.01)

(52) U.S. Cl. .............. 250/227.11; 250/341.1; 136/243; 398/201; 257/432

(58) Field of Classification Search .......... 250/214 R, 250/227.11, 227.14, 341.1, 341.6, 371; 398/201; 359/326; 385/129; 372/43.01; 257/431, 257/432, 414, E31.011, E31.033; 60/641.1, 60/641.8; 438/27, 57; 136/200, 243, 252, 136/253, 256
See application file for complete search history.

(56) References Cited

U.S. PATENT DOCUMENTS

| | | | |
|---|---|---|---|
| 5,990,850 A * | 11/1999 | Brown et al. | 343/912 |
| 6,583,350 B1 | 6/2003 | Gee et al. | |
| 6,756,594 B2 * | 6/2004 | George et al. | 250/343 |
| 6,891,869 B2 | 5/2005 | Augustol | |
| 7,078,697 B2 * | 7/2006 | Barker et al. | 250/343 |
| 7,120,338 B2 | 10/2006 | Gunn | |
| 7,257,333 B2 * | 8/2007 | Rosenwald et al. | 398/201 |
| 7,282,798 B2 * | 10/2007 | Venkatasubramanian | 257/713 |
| 2004/0013377 A1 * | 1/2004 | Han | 385/125 |
| 2004/0175087 A1 * | 9/2004 | Soljacic et al. | 385/129 |
| 2006/0076518 A1 * | 4/2006 | Barker et al. | 250/504 R |
| 2006/0140567 A1 | 6/2006 | Kittaka et al. | |

(Continued)

OTHER PUBLICATIONS

Cornelius et al., "Modification of planck blackbody radiation by photonic band-gap structures," Physical Review A vol. 59, No. 6, Jun. 1999, pp. 4736-4746.

(Continued)

*Primary Examiner*—John R Lee
(74) *Attorney, Agent, or Firm*—Eric A. Gifford

(57) ABSTRACT

Methods and systems for extracting energy from a heat source using photonic crystals with defect cavities generally comprise a photonic crystal, a cavity, and a converter. The photonic crystal is responsive to a heat source and generates an electromagnetic beam in response to incidence with the heat source. The photonic crystal exhibits a band gap such that wavelengths within the band gap are substantially confined within the photonic crystal. The cavity is substantially within the crystal and is responsive to the electromagnetic beam such that the cavity transmits the electromagnetic beam to a specified location. The converter is substantially collocated with the specified location and extracts energy in response to incidence with the electromagnetic beam.

18 Claims, 8 Drawing Sheets

U.S. PATENT DOCUMENTS

| | | | |
|---|---|---|---|
| 2006/0147213 A1* | 7/2006 | Rosenwald et al. | 398/121 |
| 2006/0191566 A1* | 8/2006 | Schaafsma | 136/246 |
| 2007/0147752 A1 | 6/2007 | Weisbert et al. | |
| 2008/0084604 A1* | 4/2008 | Barker et al. | 359/326 |
| 2009/0014059 A1* | 1/2009 | Radhakrishnan et al. | 136/248 |
| 2009/0071529 A1* | 3/2009 | Barker et al. | 136/248 |
| 2009/0126783 A1* | 5/2009 | Lin et al. | 136/252 |
| 2010/0108916 A1* | 5/2010 | Barker et al. | 250/495.1 |
| 2010/0139289 A1* | 6/2010 | Barker et al. | 62/3.2 |

OTHER PUBLICATIONS

Dowling, Jonathan, "Coulomb scattering near mirrors: quantum corrections to the rutherford formula," Physical Review A, vol. 45, No. 5, Mar. 1, 1992, pp. 3121-3125.

Yablonovitch, et al. "Inhibited spontaneous emission in solid-state physics and electronics," Physical Review Letters, vol. 58, No. 20, May 18, 1987, pp. 2059-2062.

Enoch et al., "A metamaterial for directive emission," Physical Review Letters, vol. 89, No. 21, Nov. 18, 2002, pp. 213902-1-213902-4.

Lin et al., "A three-dimensional photonic crystal operating at infrared wavelengths," Nature, vol. 294, Jul. 16, 1998, pp. 251-253.

Li et al., Modified thermal radiation in three-dimensional photonic crystals, The American Physical Society, 2002, pp. 241103-1-241103-4, (Dec. 2002).

Cregan et al., "Single-mode photonic band gap guidance of light in air," Science, 285, 1999, pp. 1537-1539, (Sep. 1999).

John, Sajeev, "Strong Localization of photons in certain disordered dielectric superlattices," The American Physical Society, vol. 58, No. 23, Jun. 8, 1987, p. 2486.

Takahashi et al., "Simultaneous inhibition and redistribution of spontaneous emission in 2D photonic crystal slabs," SPIE, vol. 6127, pp. 612718-1-612718-10, (2006).

Jovanovic et al., "Design, fabrication and testing of energy-harvesting thermoelectric generator," SPIE, vol. 6173, pp. 61730G-1-61730G-8, (2006).

Licciulli et al., "The challenge of high-performance selective emitters for thermophotovoltaic applications," Semicond. Science and Technol. 18(2003), pp. S174-S183, (Apr. 2003).

Torsello et al., "The origin of highly efficient selective emission in rare-earth oxides for thermophotovoltaic applications," Nature Publishing Group, vol. 3, Sep. 2004, pp. 632-637.

Ghamaty et al., "Quantum well thermoelectric devices and applications," IEEE 22nd International Conf. on Thermoelectrics, (2003), p. 563-566.

Rohr, Carsten, InGaAsP quantum well cells for thermophotovoltaic applications, Ph.D. Theses, University of London, Imperial College, Apr. 2002, p. 1-144.

Ekins-Daukes et al., Photovoltaic efficiency enhancement through thermal up-conversion, 3rd World Conference on Photovoltaic Energy Conversion, Osaka, May 2003, pp. 1-4.

Bass et al., "New technology for thermoelectric cooling," IEEE, 20th Semi-Therm Symposium, 2004, pp. 1-3.

Benoit et al., "Static and dynamic properties of optical microcavities in photonic bandgap yarns," Adv. Mater. 15, No. 24, Dec. 17, 2003, pp. 2053-2056.

Greffet et al, "Coherent emission of light by thermal sources," Nature, vol. 416, Mar. 7, 2002, pp. 61-64.

Altug et al., "Photonic crystal nanocavity arrays," IEEE LEOS Newsletter, Apr. 2006, pp. 4-11.

* cited by examiner

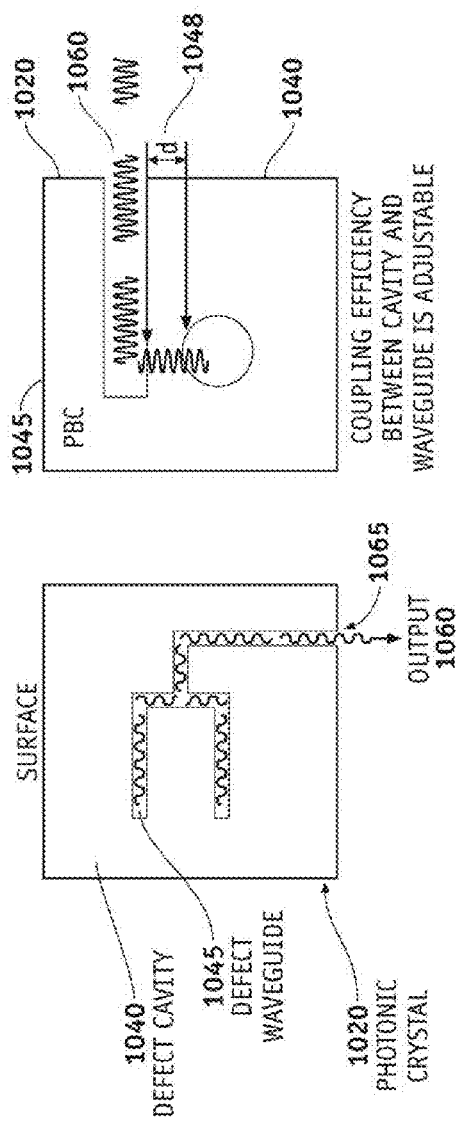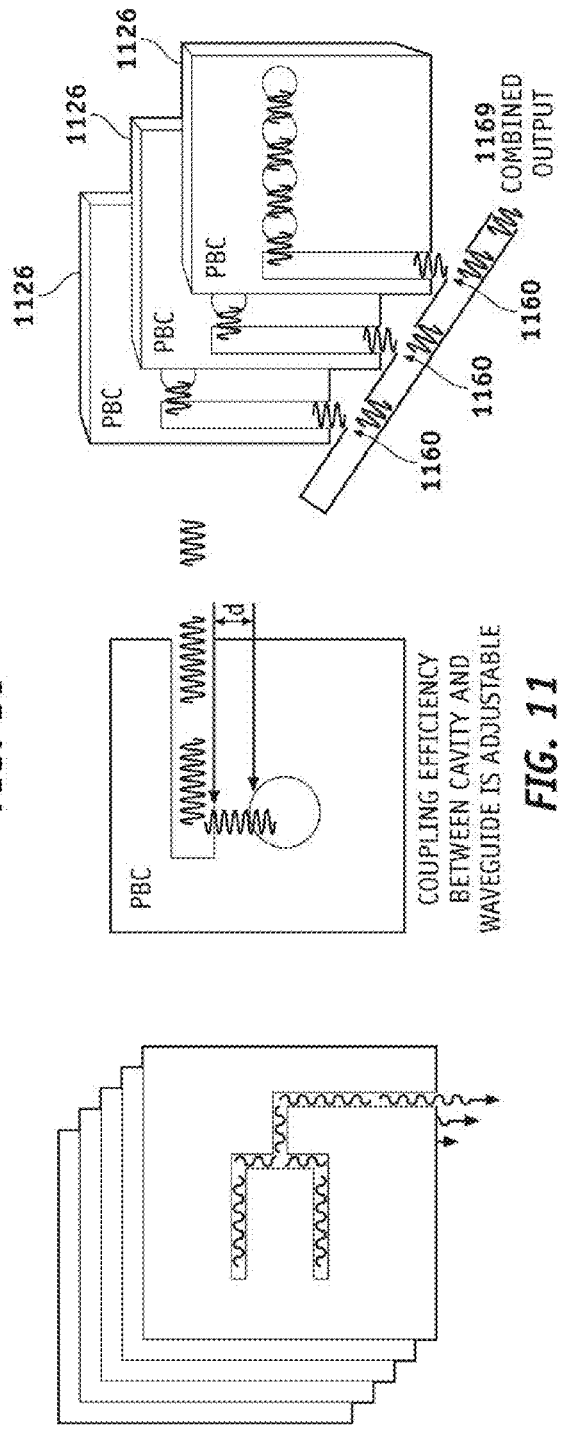

METHODS AND SYSTEMS FOR EXTRACTING ENERGY FROM A HEAT SOURCE USING PHOTONIC CRYSTALS WITH DEFECT CAVITIES

CROSS-REFERENCE TO RELATED APPLICATION

This application claims the benefit of U.S. Provisional Patent Application No. 60/972,070 filed Sep. 13, 2007, and incorporates the disclosure of that application by reference.

BACKGROUND OF INVENTION

Heat emanating from a heat source is often wasted because it is not converted into another useful form of energy. Harnessing this heat and converting it into another form of energy would have many useful applications. Photonic crystals containing defect cavities and waveguides permit extraction of some of this heat energy as narrow waveband, narrowly directed electromagnetic radiation beams.

SUMMARY OF THE INVENTION

In various embodiments, a method and system for extracting energy from a heat source may comprise a photonic crystal, cavities, and waveguides. The photonic crystal is responsive to a heat source and generates an electromagnetic beam in response to incidence with the heat source. The photonic crystal exhibits a band gap such that wavelengths within the band gap are substantially confined within the photonic crystal resonant defect cavities. The cavities and waveguides reside substantially within the photonic crystal and are responsive to the electromagnetic beam such that the cavity/waveguide combination transmits the electromagnetic beam to a particular location. In one embodiment, the method and system for extracting energy from a heat source may also comprise a converter substantially collocated with the particular location and configured to extract energy in response to incidence with the electromagnetic beam.

BRIEF DESCRIPTION OF THE DRAWINGS

A more complete understanding of the methods and systems for extracting energy from a heat source using photonic crystals with defect cavities may be derived from referring to the detailed description and claims when considered in connection with the following illustrative figures. In the following figures, like reference numbers refer to similar elements and steps throughout the figures.

FIG. 10 representatively illustrates an embodiment of a 2-D photonic crystal slab.

FIG. 11 representatively illustrates a stacked 3-D photonic crystal comprised of stacked 2-D slabs of photonic crystals with combined output.

Elements and steps in the figures are illustrated for simplicity and clarity and have not necessarily been rendered according to any particular sequence. For example, steps that may be performed concurrently or in different order are illustrated in the figures to help to improve understanding of embodiments of the methods and systems for extracting energy from a heat source using photonic crystals with defect cavities.

DETAILED DESCRIPTION OF EXEMPLARY EMBODIMENTS

The method and system for extracting energy from a heat source by a photonic crystal with resonant defect cavities may be described in terms of functional block components and various processing steps. Such functional blocks may be realized by any number of components configured to perform the specified functions and achieve the various results.

Figure 1:
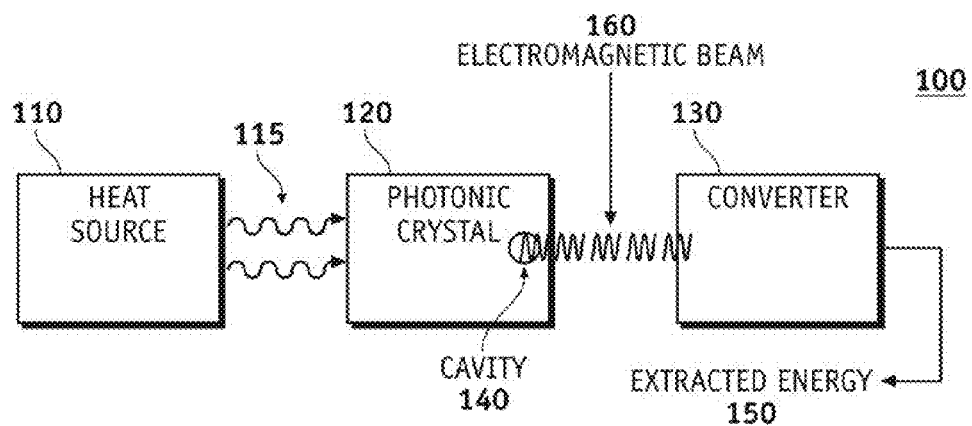
FIG. 1 representatively illustrates a system for extracting energy from a heat source.

Turning now to FIG. 1, a system 100 for extracting energy 150 from a heat source 110 according to various embodiments may comprise a photonic crystal 120 and a converter 130 to provide, for example, electrical power. The photonic crystal 120 may further comprise cavities 140, which generate radiation, for example, an electromagnetic beam 160. The energy extracting system 100 may be adapted for operation in conjunction with any appropriate application, for example: cooling electronic components while generating usable narrow band radiation, signal generation, passive infrared tags for identification, passive THz sources, self-powered spectrometers, redirecting surface radiation, medium wavelength infrared illuminators driven by engine waste heat, generating power, charging batteries with waste heat, and/or other applications for removing or utilizing heat.

In an embodiment, the heat source 110 may comprise any source of heat 115, and the heat source 110 may also comprise any system for transferring heat 115 or that requires cooling, for example: an engine, an electrical component, a person, a computer, a chemical reaction, the sun, ambient air, etc. The heat source 110 may thermally stimulate the photonic crystal 120 to generate the radiation 160, which may be either dissipated, converted and used, or any combination of dissipation and converted use. The heat source 110 may generate heat 115 by any appropriate manner, for example: by an exothermic reaction, friction, electrical resistance, and the like. Among various embodiments, the heat source 110 may be in contact with the photonic crystal 120, in close proximity to the photonic crystal 120, or fully separated from the photonic crystal 120. In addition, the heat source 110 may originate from inside the photonic crystal 120 (e.g. radioactive materials) or outside the photonic crystal 120.

In an embodiment, the heat source 110 may affect the temperature of the photonic crystal 120. For example, the temperature of the photonic crystal 120 may range from just above ambient temperature to at or below the melting point of the material of the photonic crystal 120. Among various embodiments, the temperature of the photonic crystal 120 may range from 200 K to 2000 K, and more specifically, the temperature of the photonic crystal may range from 300 K to 1000 K. The heat source 110 may transfer heat to the photonic crystal 120 by any relevant heat transfer process, for example: conduction, convection, or radiation. Thermal stimulation of the photonic crystal 120 by the heat source 110 does not necessarily require atomic motion through a medium, but may also be produced by energy incident on the photonic crystal 120 in another form, for example electromagnetic radiation. For example, electromagnetic waves from sunlight incident on the photonic crystal 120 may thermally stimulate the photonic crystal 120.

Figure 2:
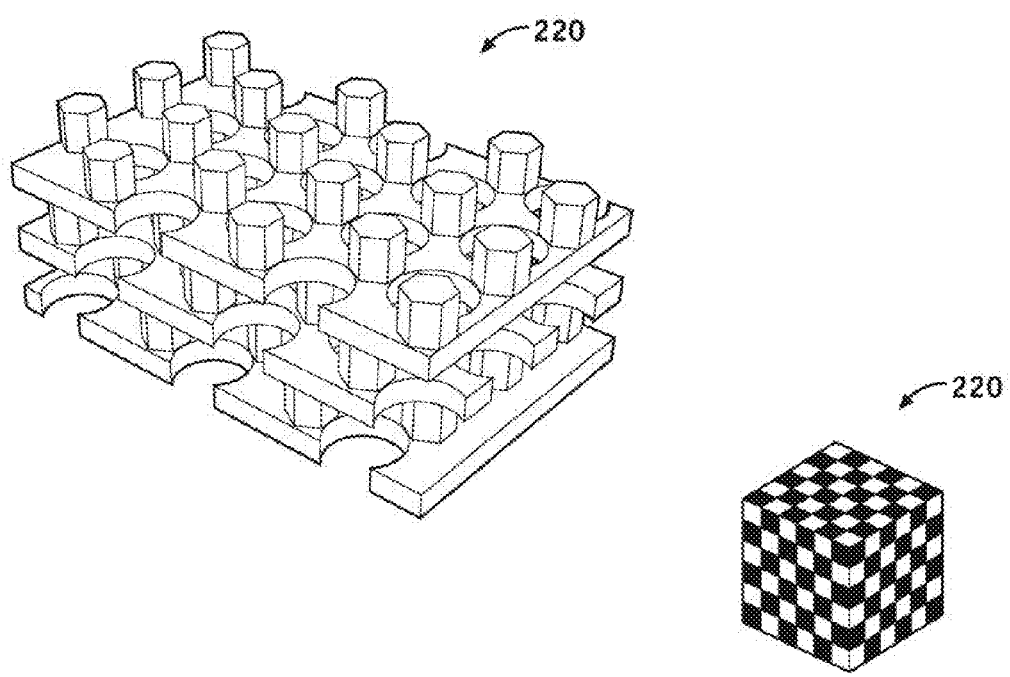
FIG. 2 representatively illustrates a geometric configuration of a 3-D photonic crystal FIG. 3 representatively illustrates a Planck spectrum of blackbody radiation for a material at different temperatures.

In an embodiment, the photonic crystal 120 may comprise various materials and configurations. Among the various embodiments, configurations of the photonic crystal 120 may exhibit a periodic high-contrast modulation of the local index of refraction (or dielectric constant, for non-magnetic materials) in one, two or three dimensions (see for example J. D. Joannopoulos, R. D. Meade, and J. N. Winn, "Photonic Crystals: Molding the Flow of Light," Princeton: Princeton University Press (1995), or C. Lopez, "Materials Aspects of Photonic Crystals," Advanced Materials 15, 1679 (2003)). Any two substances comprising sufficient contrast between their respective indices of refraction may be placed in a stable periodic arrangement comprising a particular geometry, spacing and shape of the constituent substances to create a photonic crystal for a particular range of photon wavelengths. Radiation propagating in such a structure undergoes multiple Bragg scattering from a lattice array and multiple Mie scattering off of individual scattering elements. Under certain conditions, the multiple-scattered waves interfere destructively, resulting in minimal transmission over a broad range of wavelengths, which is termed the "band gap". The photonic band gap ("PBG") is complete when transmission is blocked for all angles of incidence and all polarization states within the wavelength band. In one embodiment, the photonic crystal 120 may comprise materials, for example, silicon and air, but the photonic crystal 120 may also comprise other materials, for example, SiN, $SiO_2$, plastics, metals, ceramics, composites, and many other materials, whether solid, liquid, or gas. For example, with reference to FIG. 2, a geometric configuration of a 3-D photonic crystal 220 is shown comprising the repeating periodic structure of two materials.

Figure 3:
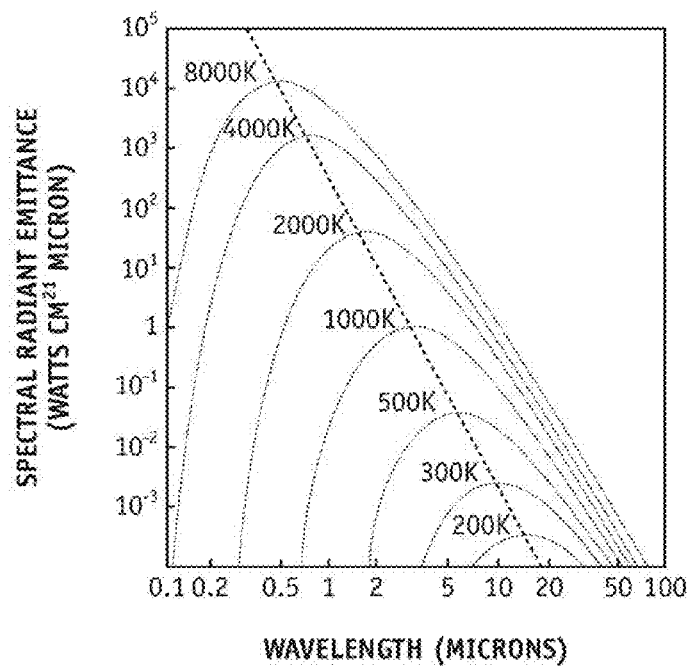

Among the various embodiments, and returning to FIG. 1, the photonic crystal 120 generates radiation 160 in response to heat 115 by spontaneous emitting radiation 160, for example Planck radiation, from thermally excited dipole radiators (not shown) within the photonic crystal 120. The radiation 160 may comprise a wide range of wavelengths that may lie along any portion of the electromagnetic spectrum. For example, the radiation 160 may comprise: ultraviolet light, visible light, infrared light, light in the terahertz frequency range, etc, and in one embodiment, the photonic crystal 120 may exhibit a peak in Planck radiation at a selected wavelength. For example, FIG. 3 graphically shows the Plank spectrum of blackbody radiation for a material at different temperatures.

Among the various embodiments, the radiation 160 may travel outward in all directions from the dipole radiator that generates it. The photonic crystal 160 may exhibit a band gap, i.e., a photonic band gap ("PBG"), such that wavelengths within the band gap are substantially confined within the photonic crystal 160 in at least one direction. The band gap is an inherent property of the photonic crystal 160 caused by the destructive interference of certain wavelengths due to scattering events such as diffraction and refraction. For example, A 1-D photonic crystal confines the light within the band gap in only one direction, a 2-D photonic crystal confines the light in a plane, and a 3-D photonic crystal confines the light in all directions. In various embodiments of the photonic crystal 160, the band gap may be altered or tuned by applying an external magnetic field or physical pressure. For example, and with reference to FIG. 4, a system 400 shows one manner by which the photonic crystal 420 emitting radiation 460 may be tuned to a particular orientation 465 by the application of an external magnetic field 480.

Figure 5:
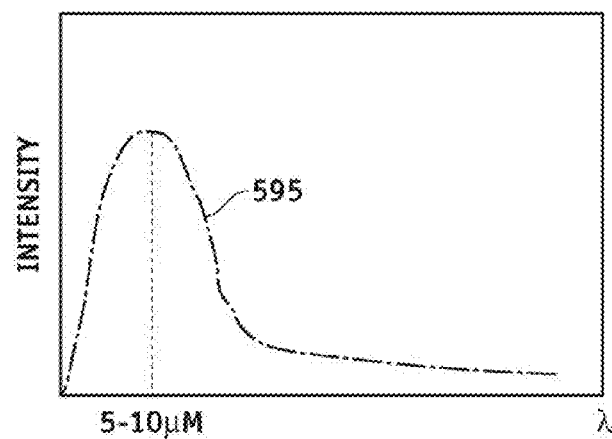
FIG. 5 representatively illustrates a Planck blackbody radiation spectrum that may be modified with a band gap positioned around a peak.

Among the various embodiments, the photonic crystal 120 converts thermal energy to radiation 160 substantially within one or more selected frequency ranges. As the temperature ("T") of the photonic crystal 120 increases, the radiation 160 in one or more selected bands increases almost linearly with T. Heat 115 supplied to the photonic crystal 120 may be converted into emissions 160 in the selected emission bands, for example the THz band. For example, and with reference to FIG. 5, a photonic crystal's Planck blackbody radiation spectrum may be modified with a band gap positioned around a peak 595 (e.g., 5-10 μm) of the Planck spectrum. Several theoretical and experimental papers in this area have been published, for example, Zhi-Yuan Li, Phys. Rev. B 66, R241103 (2002) and S-Y. Lin, et al, Phys. Rev. B 62, R2243 (2000). Li's paper describes modeling a redistribution of the photon density of states ("DOS") in the emission region of the Planck spectrum as full and partial photonic band gaps that are manipulated by varying the photonic crystal's geometry and material. A three-dimensional photonic crystal may redistribute the photon DOS among different frequency bands and the redistribution may be used to modify the thermal radiation from the photonic crystal.

As further described by Li, orders-of-magnitude enhancement of the DOS may occur in low-DOS bands within the long-wavelength region of a designed photonic crystal. This leads to significantly enhanced thermal radiation emissions in the visible waveband (approximately 0.5 μm) for a modest cavity temperature. Since the underlying physics of the above conclusion should be generic, the physics may be applied to a selected thermally-generated region of the spectrum as well.

The photonic crystal according to various embodiments, shifts thermal energy in the photonic crystal structure towards a selected spectral range, for example the Terahertz spectral region, and collects the internal energy for emission in a single direction. For example, referring to FIGS. 6 and 7, the DOS of a photonic crystal 620 may be configured to enhance spectral emissions 660 in the THz region 770 (0.3 THz to 10 THz) (FIG. 7), particularly when heated by a heat source 610. The photonic crystal 620 may exhibit peaks in its photon DOS, and may be configured to amplify DOS peaks in the desired bands, for example the THz band, and suppressed elsewhere. Therefore, the final emission states are constrained to the desired spectral band by the use of the photonic crystal 620 having symmetries and lattice constants adjusted to exhibit the appropriate characteristics.

Figure 6:
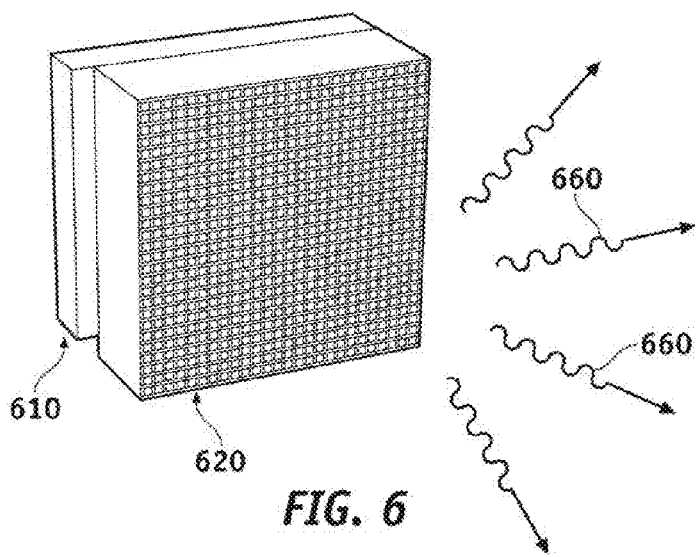
FIG. 6 representatively illustrates a photonic crystal according to an embodiment of a system for extracting energy from a heat source.
Figure 7:
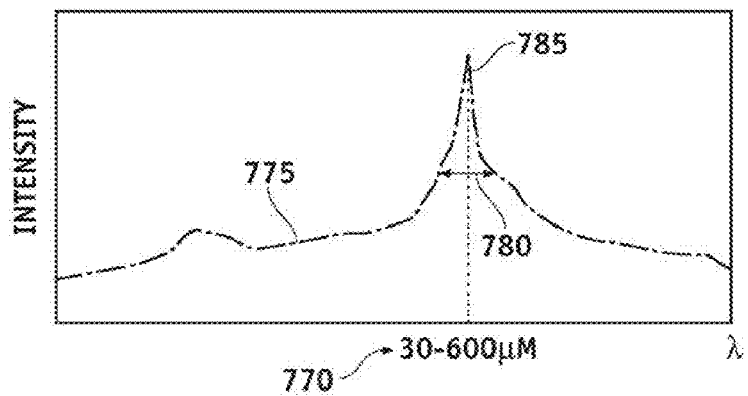
FIG. 7 representatively illustrates a plot of a photonic crystal modified Planck spectrum having a sharp emission peak in the THz region.

As shown in FIGS. 6 and 7, the photonic crystal 620 may comprise a single photonic crystal structure 620 in which the DOS may be designed and optimized to create a modified Planck spectrum 775 in which the strongest emission peak may be shifted toward a desired spectral range, for example the THz spectrum 770, for example by at least a factor of three. The bandwidth 780 of the emission peak 785 may be selected according to the application, for example, less than 20% of the center frequency of the peak and, in one example, less than 10%, which may be narrow enough for many imaging and spectroscopy applications.

Among the various embodiments, a photonic crystal may comprise dimensions commensurate with the application, and in one embodiment may comprise dimensions in the sub-millimeter range. In addition, some photonic crystals may exhibit enhanced emission of certain wavelengths of light near the edge of the band gap, and such photonic crystals may be configured to produce that range of wavelengths by customizing the size, geometry, and spacing of the periodic structure, as described above.

Figure 8:
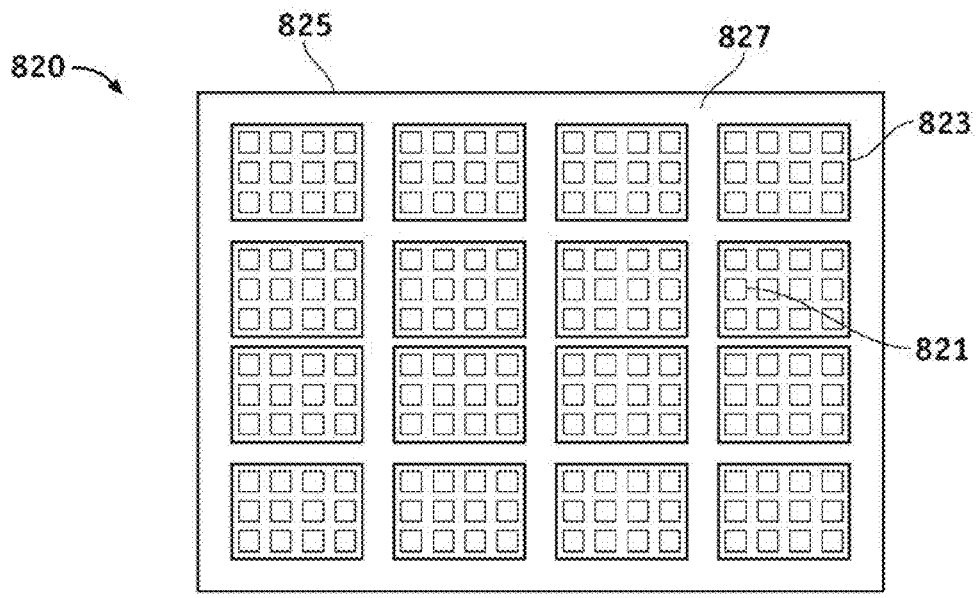
FIG. 8 representatively illustrates a triple embedded structure according to an embodiment of a system for extracting energy from a heat source.

Continuing with various embodiments of the methods and systems for extracting energy from a heat source using photonic crystals with defect cavities, an embedded structure approach adds another photonic crystal layer in the overall structure, which provides more degrees of freedom in designing the photon DOS of the radiation core. The higher-frequency emission peak may be at the Planck distribution peak so that it strongly emits the normal Planck radiation, and/or a lower-frequency emission peak may enhance another spectral range, for example THz radiation. Further, the dual-band photonic crystal facilitates physical integration of the radiation core and a network of radiation collecting and radiation guiding structures, which may lead to further improvement in efficiency and reduction of cost, size and weight of the photonic crystal. Moreover, embedding structures within a coarser structure may be implemented with more than two bands. Periodic structures may be embedded on larger and/or smaller scales according to the desired band gap and/or emission peak effects. The number of bands may be selected according to any suitable criteria. For example, and referring to FIG. 8, a triple-embedded structure 820 may comprise rectangles 821 embedded within rectangles 823, which may be further embedded within rectangle 825. Each rectangle 821, 823, 825 may comprise a different material, and a matrix 827 may consist of empty space.

Figure 9:
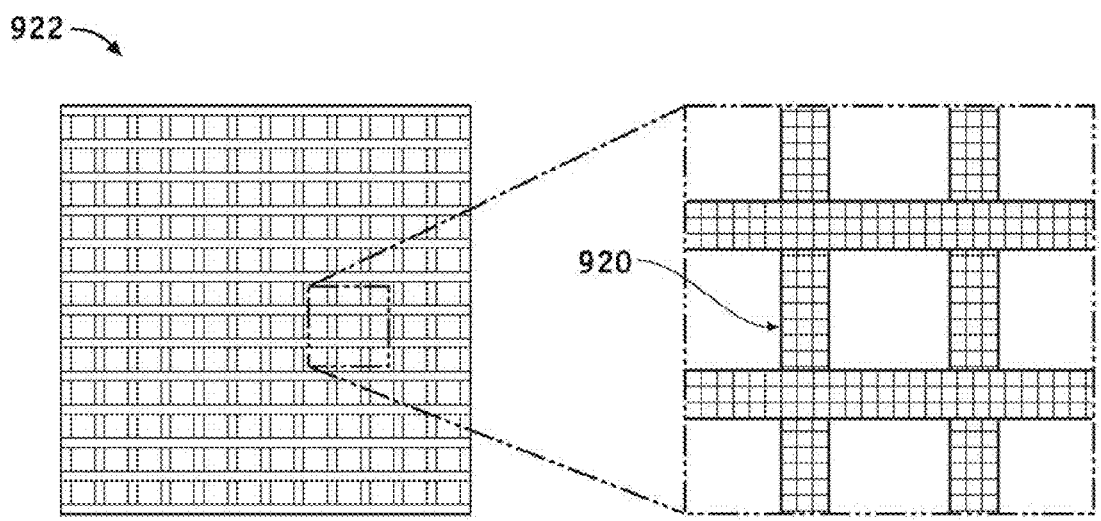
FIG. 9 representatively illustrates an embedded structure according to an embodiment of a system for extracting energy from a heat source.

In another embodiment, a photonic crystal may comprise a core that may include two or more distinct photonic crystal structures, i.e., embedded structures, one structure comprising an emission peak near the desired spectral region, for example the THz region, for wave guiding purposes, and the other structure comprising a band gap at an independent frequency higher than the desired spectral region. For example, and with reference to FIG. 9, because the unit-cell sizes of photonic crystal structures giving rise to the two DOS distributions may be considerably different, the fine (higher frequency band) photonic crystal structure 920 may be embedded within a coarse (lower frequency band, e.g., THz) photonic crystal structure 922.

In one embodiment, a photonic crystal may comprise a 2-D photonic crystal slab. The cross section of such a structure is representatively illustrated in FIG. 10. The photonic crystal slab 1020 contains multiple cylindrical cavities 1040 and a long cuboidal cavity 1045, which may be used as a waveguide. Since FIG. 10 comprises a cross section, the cylindrical cavities 1040 appear circular and the cuboidal cavity 1045 appears rectangular. The photonic crystal slab 1020 may also comprise several long cuboidal cavities. In one embodiment, the spherical cavities 1040 may comprise equal size and spacing so that they all emit the same range of wavelengths, or the spherical cavities 1040 may comprise different sized spherical cavities (not shown) so that different wavelengths are emitted. Wavelengths may be combined into a single output 1060 by combining the beams in the long cavity 1045 that serves as a waveguide, or by combining them once they exit the photonic crystal 1020. In addition, one could simply use different slabs for each wavelength, with the slabs being stacked, as illustrated in FIG. 11, to increase heat capacity. In the example shown by FIG. 11, the emitted beams 1160 from each photonic crystal slab 1120 may be combined to produce a combined output 1169 such that the final output may be configured to comprise of a broad or a narrow range of wavelengths. Among the various embodiments, and as further shown in FIGS. 10 and 11, a coupling efficiency between a cavity and a long cavity (i.e., a waveguide) may comprise an adjustable distance. For example, FIG. 10 shows distance 1048, which is the distance between the cavity 1040 and the long cavity 1045. Distance 1048 may be customized in other photonic crystal embodiments as desired.

Figure 12:
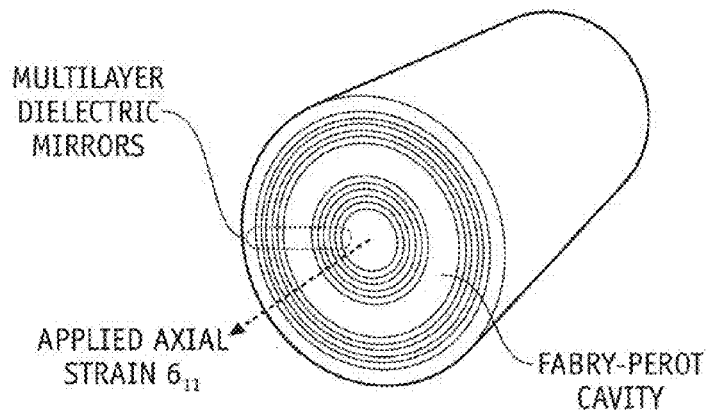
FIG. 12 representatively illustrates a hollow core 2-D photonic crystal fiber using multilayer dielectric mirrors to create a band gap.
Figure 13:
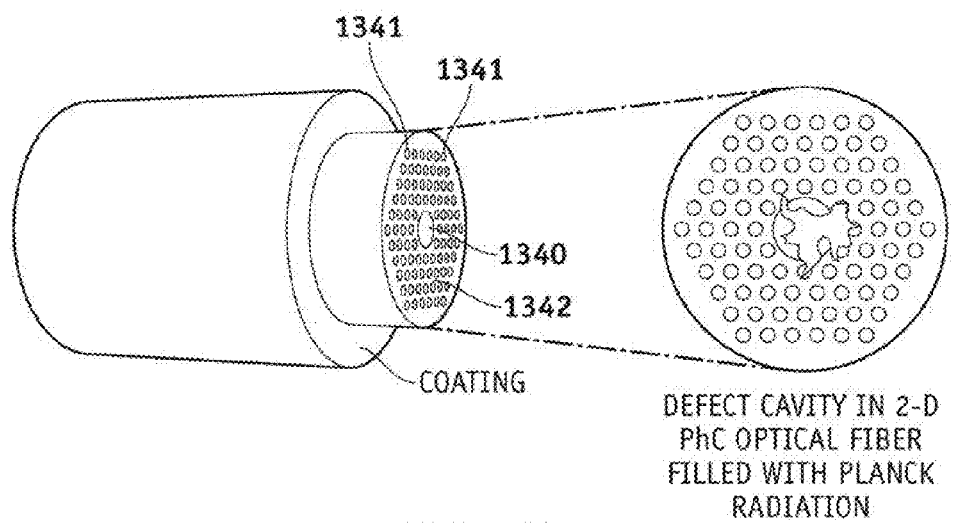
FIG. 13 representatively illustrates a hollow core 2-D photonic crystal fiber using holes extending the length of the fiber to create a band gap.
Figure 14:
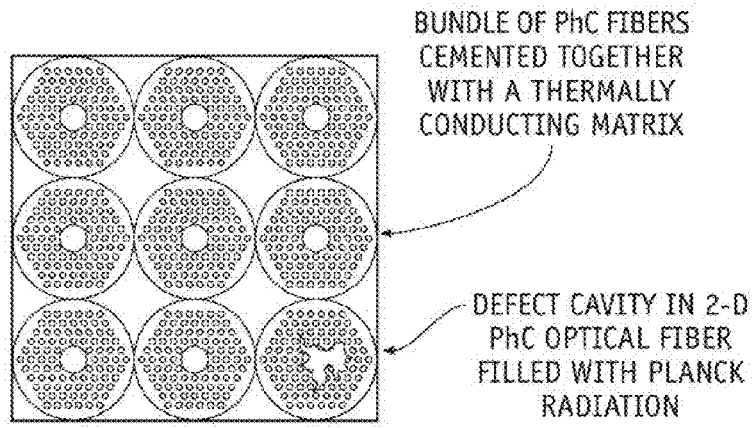
FIG. 14 representatively illustrates a bundle of photonic crystal fibers-cemented together with a thermally conducting matrix.

In another embodiment, a photonic crystal may comprise a 2-D photonic crystal fiber. A band gap my be created in a cladding of the fiber by utilizing multilayer dielectric mirrors, as illustrated in FIG. 12, or by utilizing holes extending the length of the fiber, as illustrated in FIG. 13. The mirrors or the holes create the diffraction, refraction, and destructive interference necessary to create a 2-D photonic band gap in the plane that may be substantially perpendicular to the length of the fiber. In either case the center of the fiber contains a cylindrical hole that extends the length of the fiber and serves both as a cavity and a waveguide. For example, in FIG. 13 a center hole 1340 may serve as a cavity simply because it is of a different size than the surrounding holes 1341 in the cladding 1342. In an embodiment, a permanent magnet, such as shown in the embodiment illustrated in FIG. 4, may be placed around either of these fiber types to orient the dipole radiators such that they generate waves in the plane of the band gap which then travel along the cavity to the specified location. By using such a magnet the system becomes more efficient by coercing the dipole radiators to produce radiation that lies in the forbidden plane and thus ends up being transmitted to the cavity/waveguide. In one embodiment, individual fibers may be cemented together in a thermally conducting matrix so as to produce more output, as shown in FIG. 14.

Figure 15:
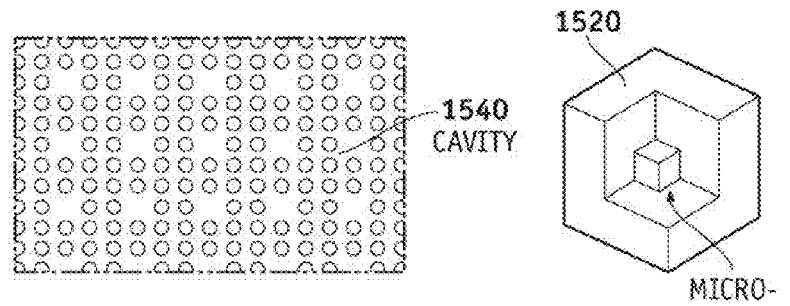
FIG. 15 representatively illustrates a cavity.

Among various embodiments, and returning to FIG. 1, the photonic crystal 120 may comprise a cavity 140 that may lie substantially within the photonic crystal 120, and the cavity 140 may be responsive to the electromagnetic beam 160, wherein the cavity 140 may transmit the electromagnetic beam 160 to a particular location. In an embodiment, the cavity 140 may comprise a disruption in the periodic structure of the photonic crystal 120. In another embodiment, the cavity 140 may comprise an absence of material in a location where material would otherwise be present due to the periodic structure of the photonic crystal 120. In another embodiment, the cavity 140 may also comprise a presence of material in a location where material would otherwise not be present due to the periodic structure of the photonic crystal 120. In yet another embodiment, the cavity 140 may also comprise the presence of a material in a location where a different type of material would otherwise be present due to the periodic structure of the photonic crystal 120. In still yet another embodiment, the cavity 140 may also comprise a change in feature sizes. For example, within a structure of the photonic crystal 120, the photonic crystal 120 may comprise a matrix filled with periodic voids comprising similar sizes. Within this example, a void comprising a different size may be considered a cavity. In an example of an embodiment, FIG. 15 is an illustrative representation of the cavity 140. In FIG. 15, a cavity 1540 within photonic crystal 1520 may comprise the presence of material in a location where material would not otherwise be present due to the periodic structure of the photonic crystal 1520.

Among various embodiments, the cavity 140 may comprise any shape. For example, the cavity 140 may comprise conventional shapes, for example spherical, cylindrical, cubical, elliptical, and the like shapes, however the cavity 140 may not comprise conventional shapes at all, but rather may comprise any regular or irregular shape. Moreover, the cavity 140 may comprise any size, and the cavity 140 may be located anywhere within or substantially within the photonic crystal 120.

In one embodiment, a photonic crystal may comprise of more than one cavity, e.g. multiple cavities. One characteristic of multiple cavities is that they may be configured to resonate with one another by adjusting the size and the distance between the cavities; the size and location of the multiple cavities may be configured such that one cavity may couple its energy with the energy from another proximate cavity. In such an embodiment, one cavity effectively "leaks" electromagnetic radiation to the proximate cavity, and the amount of electromagnetic radiation leaked to the proximate cavity may be dependent on the amount of material between the two cavities.

Continuing with an embodiment of multiple cavities, such multiple cavities may comprise varying shapes and sizes. For example, in one embodiment, the cavities may be all cylindrical and identical in size except one cavity, which may be cuboidal in shape. As previously shown in FIG. 10, where FIG. 10 comprises a cross section, the cylindrical cavities 1040 appear circular, and the cuboidal cavity 1045 appears rectangular. The cylindrical cavities 1040 in such a case couple with other proximate cylindrical cavities 1040 and the cylindrical cavity 1040 proximate to the cuboidal cavity 1045 may couple with the cuboidal cavity 1045, such that the electromagnetic radiation 1060 may leak from the cylindrical cavities 1040 into the cuboidal cavity 1045 and the electromagnetic radiation 1060 may travel along the cuboidal cavity 1045 to a particular location, i.e., location 1065.

Figure 4:
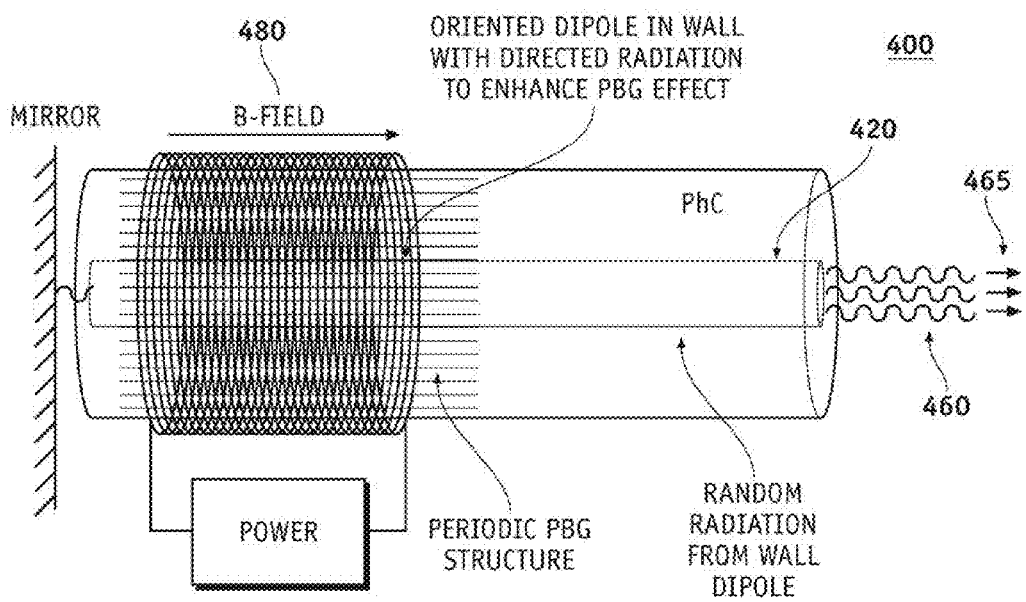
FIG. 4 representatively illustrates a system that utilizes a permanent magnet to orient dipole radiators in a 2-D photonic crystal fiber.

Among the various embodiments, a cavity may be configured such that a narrow band of wavelengths within a band gap, as described earlier, encounters constructive interference when it enters a cavity, thus resulting in little loss within the cavity, i.e., the cavity may comprise a high Q factor. The cavity may be configured such that the wavelength of the peak Planck radiation of the photonic crystal encounters constructive interference within the cavity and may be leaked to other cavities, as described above. Furthermore, the cavity may be tuned using external pressure or a magnetic field to determine which wavelength within the band gap encounters constructive interference within the cavity, again as shown in FIG. 4.

Among the various embodiments, increasing the number of cavities may be desirable because the increased surface area allows more energy to be extracted from the photonic crystal in the form of electromagnetic radiation. In sum, a photonic crystal may comprise some or all of the above embodiments of a cavity and/or cavities, as well as others now known or further developed.

Among the various embodiments, the methods and systems for extracting energy from a heat source using photonic crystals with defect cavities may comprise a wave guide and/or power combining structure such that radiation energy may be efficiently collected and/or directed, for example to an output antenna For example, a series of cavities comprising variable-Q defect cavities may collect and concentrate the radiation. Among various embodiments, the cavities may be placed in a pattern to allow the electromagnetic radiation to leak to a desired location, and in a waveguide fashion, the pattern of cavities may guide the electromagnetic radiation to a particular location. Similarly, one long cavity may be used as a waveguide to guide the wave of electromagnetic radiation to a particular location. Such patterns of cavities or long cavity need not comprise a linear configuration, but rather may comprise curves, turns, and the like to guide the electromagnetic radiation with little loss.

Among the various embodiments, photonic crystals possessing waveguides and cavities have been developed for fiber optical and millimeter wave applications. Single mode photonic crystal waveguides (A. Scherer et al., IEEE Trans. Nanotech. 1, 4 (2002), optical waveguides with sharp bends (A. Mekis et al., Phys. Rev. Lett. 77, 3787 (1996)), very high-Q cavity resonators (Y. Akahane et al., Nature 425, 944 947 (2003)), and photonic crystals with tunable band gaps (H. Xin et al., IEEE Antennas and Propagation Symp. 2, 435 (2003)) have been demonstrated. Such systems may offer higher efficiency, smaller size and other unique advantages compared to conventional wave guiding components.

Figure 16:
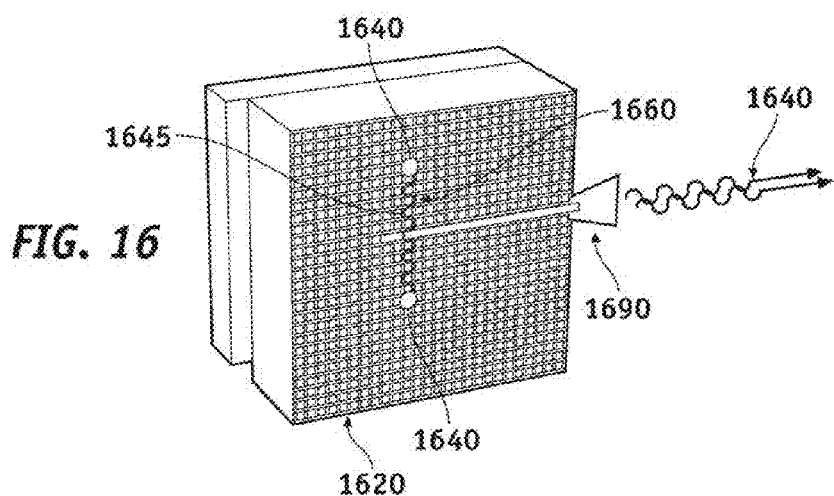
FIG. 16 representatively illustrates a photonic structure comprising cavities and a waveguide structure within the photonic crystal core for guiding THz or other frequency radiation to an antenna.

In one example, and with reference to FIG. 16, a plurality of cavities 1640 within a photonic crystal 1620 may couple radiation 1660 to a waveguide 1645, which subsequently directs the radiation 1660 to an output antenna 1690.

Figure 17:
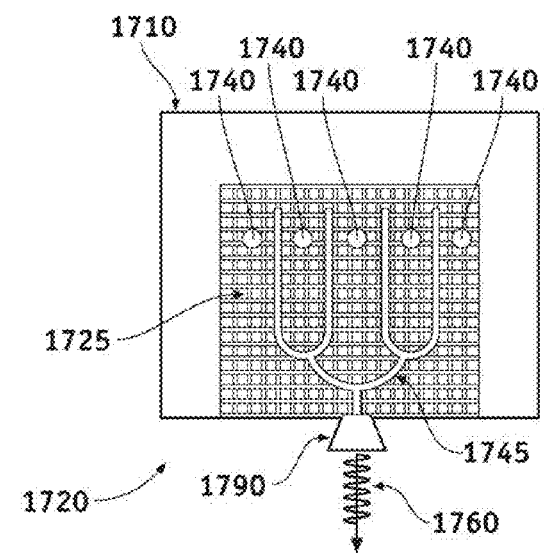
FIG. 17 representatively illustrates another photonic structure comprising cavities and a waveguide structure within the photonic crystal core for guiding THz or other frequency radiation to an antenna.

In one example, and with reference to FIG. 17, a dual-band photonic crystal THz structure 1720 may comprise both the THz radiation generation and wave guiding functions. Cavities 1740 may be formed in the coarse structure of a dual-band photonic crystal layer 1725 to collect and concentrate the THz radiation. The structure collects internal Planck radiation from the photonic crystal structure 1720, and the cavities 1740 near the waveguides 1745 collect and concentrate a narrow spectral band of the THz radiation according to the Q of the cavity 1740. In this embodiment, multiple waveguide channels 1745 may be designed and fabricated in a parallel fashion in the coarse structure of the photonic crystal layer 1725 to combine into a network of waveguides 1745 to consolidate and increase power output to a horn antenna 1790. In this approach, a network of the cavities 1740 and waveguide channels 1745 in the coarse structure may be used to localize and then couple out thermally powered THz radiation 1760 over a large volume of the entire photonic crystal structure 1720 to one or more micro-machined THz antennas, such as the horn antenna 1790. A thermal source 1710 may be formed around the exterior of the photonic crystal layer 1725. Other various architectures and geometries may be implemented using such a dual-band photonic crystal structure 1720.

In an embodiment, a system for extracting energy from a heat source may further comprise a converter 130 (FIG. 1) that converts the beam of electromagnetic radiation 160 into another form of energy 150. In an embodiment, the converter 130 may be substantially collocated with a particular location, wherein the converter 130 extracts energy in response to incidence from the electromagnetic beam 160. Among various embodiments, the converter 130 may comprise any system for converting electromagnetic radiation 160 into another form of energy 150, for example: electricity, a voltage gradient, capacitance, and the like. The converter 130 may also comprise: a photovoltaic cell, a quantum well device (for converting infrared radiation), a nanocable or nanotube device, and the like. In another embodiment, the converter 130 may be configured such that its peak output of energy 150 corresponds with the peak wavelength of electromagnetic radiation 160.

Figure 18:
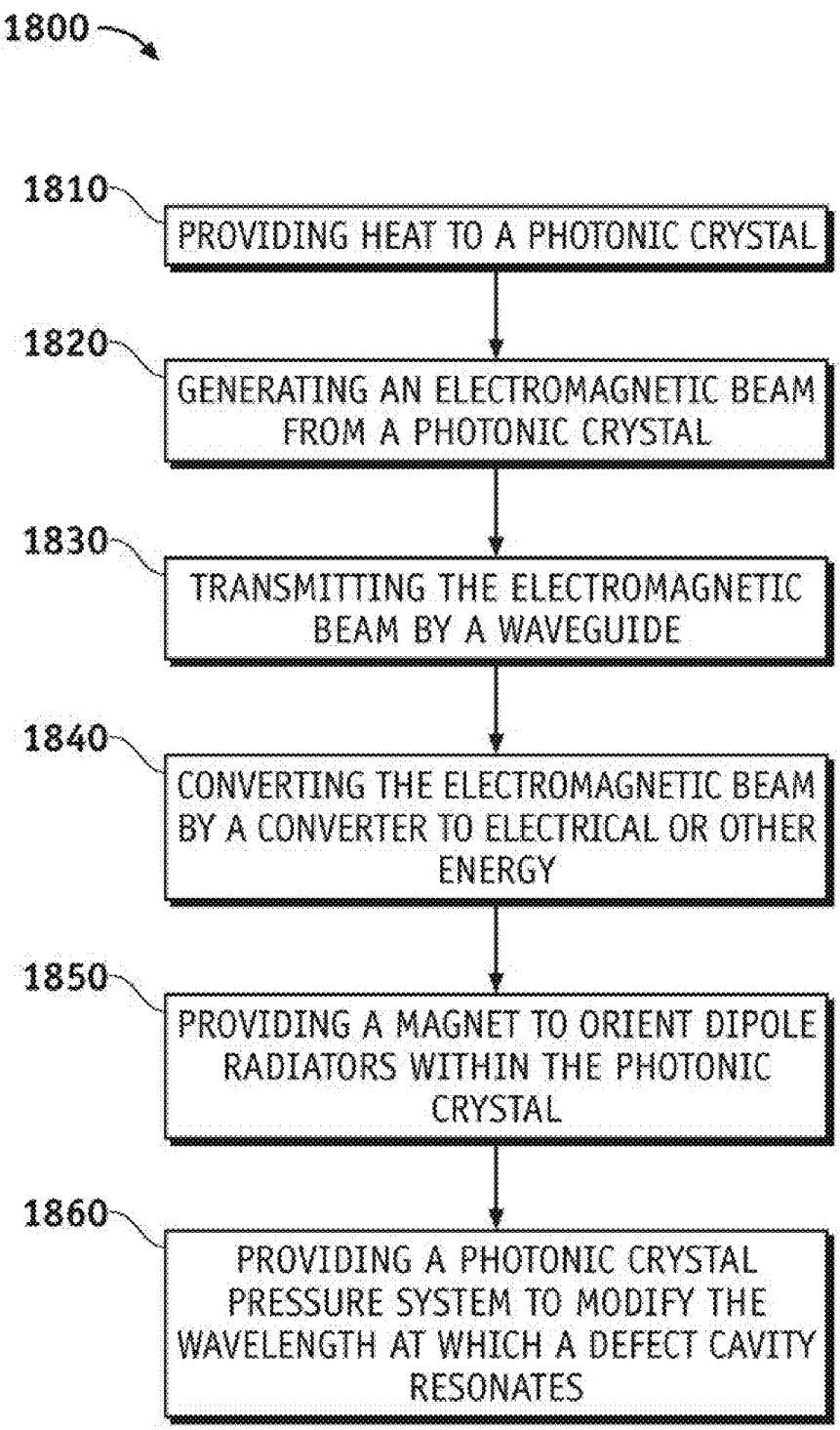
FIG. 18 representatively illustrates a flow chart comprising a method for extracting energy from a heat source.

A method 1800 for extracting energy from a heat source may comprise: providing a photonic crystal with resonant defect cavities (1810); generating an electromagnetic beam by the photonic crystal (1820); transmitting the electromagnetic beam by a waveguide (1830); and converting the electromagnetic beam by a converter (1840). The method 1800 for extracting energy from a heat source may further comprise, providing a magnet to orient dipole radiators within the photonic crystal (1850), and providing a photonic crystal pressure system to modify the wavelength at which a cavity resonates (1860). FIG. 18 illustrates a flow chart of the method 1800.

Among the various method embodiments, generating an electromagnetic beam by the photonic crystal may comprise the photonic crystal to generate the electromagnetic beam in response to incidence with the heat source, and the photonic crystal to exhibit a band gap such that wavelengths within the band gap may be substantially confined in at least one direction within the photonic crystal. Where the method comprises transmitting the electromagnetic beam by a waveguide, the waveguide may comprise a waveguide substantially within the photonic crystal, and the waveguide may transmit the electromagnetic beam to a specified location. In one embodiment, the waveguide comprises at least two adjacent cavities In another embodiment, where the method of converting the electromagnetic beam by a converter, the converter may be substantially collocated with the specified location, and the converter may extract energy in response to incidence with the electromagnetic beam. In one embodiment the converter comprises a photovoltaic cell, or the converter comprises a quantum well device.

In an embodiment of a method for extracting energy from a heat source, the method may further comprise providing the photonic crystal to further comprises cavities within the photonic crystal and the cavities may be configured to resonate at or near a peak of a Planck spectrum for the photonic crystal at a specified temperature.

Among the various method embodiments, the photonic crystal may comprise a fiber comprising a hollow core, wherein the fiber may further comprise dielectric mirrors, and/or the fiber may comprise holes that extend a length of the fiber to create the band gap. The method may also comprise the photonic crystal to comprise a slab that is substantially planar, wherein at least two slabs are stacked to increase a heat capacity, and the at least two slabs are tuned to resonate at a different temperature In the foregoing specification, the invention has been described with reference to specific exemplary embodiments. Various modifications and changes may be made, however, without departing from the scope of the methods and systems for extracting energy from a heat source using photonic crystals with defect cavities as may be set forth in the claims of any issuing patent. The specification and figures are illustrative, rather than restrictive, and modifications are intended to be included within the scope of the methods and systems for extracting energy from a heat source using photonic crystals with defect cavities. Accordingly, the scope of the invention should be determined by the claims in any issuing patent and their legal equivalents rather than by merely the examples described.

For example, the steps recited in any method or process claims in any issuing patent may be executed in any order and are not limited to the specific order presented in the claims. Additionally, the components and/or elements recited in any system claims in any issuing patent may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims in any issuing patent.

The terms "comprise", "comprises", "comprising", "having", "including", "includes" and the like refer to a non-exclusive inclusion, such that a process, method, article, composition, system, or apparatus that comprises a list of elements does not include only those elements recited, but may also include other elements not expressly listed or inherent to such process, method, article, composition, system, or apparatus. Other combinations and/or modifications of the structures, arrangements, applications, proportions, elements, materials or components used in the practice of the methods and systems for extracting energy from a heat source using photonic crystals with defect cavities, in addition to those not specifically recited, may be varied or otherwise particularly adapted to specific environments, manufacturing specifications, design parameters or other operating requirements without departing from the general principles of the same.

What is claimed is:

1. A system for extracting energy from a heat source comprising:
a photonic crystal comprising a 2-D photonic crystal fiber responsive to the heat source, wherein:
the photonic crystal generates an electromagnetic beam in response to incidence with the heat source, and
the photonic crystal fiber exhibits a 2-D band gap in a plane substantially perpendicular to the length of the fiber such that a wavelength within the band gap is substantially confined in the plane perpendicular to the photonic crystal;
said fiber comprising a cylindrical hollow core that extends the length of the fiber and serves as both a cavity and a waveguide substantially within the photonic crystal, said cavity responsive to the electromagnetic beam, wherein the waveguide transmits the electromagnetic beam to a specified location;
a magnet around the 2-D photonic crystal fiber that creates an external magnetic field to orient dipole radiators within the photonic crystal along the length of the fiber such that the dipole radiators generate waves in the plane of the band gap which travel along the waveguide to more efficiently convert heat and transmit the electromagnetic beam to the specified location; and
a power converter substantially collocated with the specified location, wherein the converter extracts energy in response to incidence with the electromagnetic beam.

2. The system of claim 1, wherein the cavity is configured to resonate at or near a peak of a Planck spectrum for the photonic crystal at a specified temperature.

3. The system of claim 1, wherein the power converter comprises a photovoltaic cell.

4. The system of claim 1, wherein the power converter comprises a quantum well device.

5. The system of claim 1, wherein the photonic crystal fiber further comprises dielectric mirrors, and the fiber comprises holes that extend a length of the fiber to create the band gap.

6. The system of claim 1, wherein at least two adjacent cavities comprise a waveguide.

7. The system of claim 1, wherein the system becomes more efficient by coercing the dipole radiators within the photonic crystal to produce radiation that lies in the forbidden plane and thus ends up being transmitted by the waveguide to the specified location.

8. A system for extracting energy from a heat source comprising:
   a photonic crystal comprising a 2-D photonic crystal fiber responsive to the heat source, wherein:
      the photonic crystal fiber generates an electromagnetic beam in response to incidence with the heat source, and
      the photonic crystal exhibits a 2-D band gap in a plane substantially perpendicular to the length of the fiber such that a wavelength within the band gap is substantially confined within the length of the photonic crystal fiber;
   said fiber comprising a cylindrical hollow core that extends the length of the fiber and serves as both a cavity and a waveguide substantially within the photonic crystal, said cavity responsive to the electromagnetic beam, wherein the waveguide transmits the electromagnetic beam to a specified location; and
   a magnet around the 2-D photonic crystal fiber that creates an external magnetic field to orient dipole radiators within the photonic crystal along the length of the fiber such that the dipole radiators generate waves in the walls of the waveguide which travel along the waveguide to more efficiently convert heat and transmit the electromagnetic beam to the specified location.

9. The system of claim 8, wherein the cavity is configured to resonate at or near a peak of a Planck spectrum for the photonic crystal at a specified temperature.

10. The system of claim 8, wherein the system becomes more efficient by coercing the dipole radiators within the photonic crystal to produce radiation that lies in the forbidden plane and thus ends up being transmitted by the waveguide to the specified location.

11. The system of claim 8, wherein the photonic crystal fiber further comprises dielectric mirrors, and the fiber comprises holes that extend a length of the fiber to create the band gap.

12. The system of claim 8, wherein the waveguide comprises at least two adjacent cavities.

13. A method for extracting energy from a heat source comprises:
   providing a photonic crystal comprising a 2-D photonic crystal fiber having a cylindrical hollow core that extends the length of the fiber and serves as both a cavity and a waveguide;
   generating an electromagnetic beam by the photonic crystal, wherein:
      the photonic crystal generates the electromagnetic beam in the cavity in response to incidence with the heat source, and
      the photonic crystal fiber exhibits a 2-D band gap in a plane substantially perpendicular to the length of the fiber such that wavelengths within the band gap are substantially confined in the plane perpendicular to the photonic crystal;
   transmitting the electromagnetic beam by the waveguide to a specified location; and
   creating an external magnetic field around the 2-D photonic crystal fiber that orients dipole radiators within the photonic crystal along the length of the fiber such that the dipole radiators generate waves in the plane of the band gap which travel along the waveguide to more efficiently convert heat and transmit the electromagnetic beam to the specified location.

14. The method of claim 13, wherein providing the photonic crystal further comprises providing cavities within the photonic crystal and the cavities are configured to resonate at or near a peak of a Planck spectrum for the photonic crystal at a specified temperature.

15. The method of claim 13, further comprising:
   converting the electromagnetic beam by a converter, wherein:
      the converter is substantially collocated with the specified location, and
      the converter extracts energy in response to incidence with the electromagnetic beam.

16. The method of claim 13, wherein the system becomes more efficient by coercing the dipole radiators within the photonic crystal to produce radiation that lies in the forbidden plane and thus ends up being transmitted by the waveguide to the specified location.

17. The method of claim 13, wherein providing the photonic crystal fiber further comprises dielectric mirrors, and the fiber comprises holes that extend a length of the fiber to create the band gap.

18. The method of claim 13, wherein the waveguide comprises at least two adjacent cavities.

* * * * *